United States Patent [19]
Canclini

[11] Patent Number: 5,495,123
[45] Date of Patent: Feb. 27, 1996

[54] STRUCTURE TO PROTECT AGAINST BELOW GROUND CURRENT INJECTION

[75] Inventor: Athos Canclini, Santa Clara, Calif.

[73] Assignee: SGS-Thomson Microelectronics, Inc., Carrollton, Tex.

[21] Appl. No.: 331,690

[22] Filed: Oct. 31, 1994

[51] Int. Cl.⁶ .............................. H01L 29/00; H01L 23/62
[52] U.S. Cl. ................... 257/500; 257/544; 257/546; 257/547; 257/550; 257/355
[58] Field of Search ................................. 157/500, 544, 157/547, 349, 355, 546, 550

[56] References Cited

U.S. PATENT DOCUMENTS

| | | | |
|---|---|---|---|
| 4,024,417 | 5/1977 | Heuber et al. | 257/551 |
| 4,412,142 | 10/1983 | Ragonese et al. | 257/575 |
| 4,458,158 | 7/1984 | Mayrand | 257/500 |
| 4,819,049 | 4/1989 | Johnston et al. | 257/550 |
| 4,879,584 | 11/1989 | Takagi et al. | 257/500 |
| 4,890,149 | 12/1989 | Bertotti et al. | 257/547 |
| 5,072,278 | 12/1991 | Paparo et al. | 257/500 |
| 5,243,214 | 9/1993 | Sin et al. | 257/500 |

*Primary Examiner*—Robert P. Limanek
*Assistant Examiner*—David B. Hardy
*Attorney, Agent, or Firm*—Kenneth C. Hill; Lisa K. Jorgenson; Richard K. Robinson

[57] ABSTRACT

An isolation structure is provided to give improved protection from below ground current injection. A first epitaxial region is provided between a power field effect device and nearby control circuitry. The first epitaxial region is tied to the substrate, and the ties are located between the first epitaxial region and the power field effect device. On the opposite side of the power device, preferably adjacent an edge of the integrated circuit chip, a second epitaxial region is formed. This epitaxial region is connected to the first epitaxial region, preferably by a metal interconnect line. A second set of substrate contacts is located between the power device and the second epitaxial region, and is tied to ground. The second epitaxial region encourages injection of current at a location spaced away from the control circuitry.

27 Claims, 2 Drawing Sheets

STRUCTURE TO PROTECT AGAINST BELOW GROUND CURRENT INJECTION

BACKGROUND OF THE INVENTION

1. Field of the Invention

The present invention relates generally to integrated circuit devices, and more specifically to power field effect device structures.

2. Description of the Prior Art

Power field effect devices continue to become increasingly popular for driving motors and other types of inductive loads. As manufacturers become more capable of producing circuits which can incorporate power field effect devices into a single integrated circuit chip with other MOS circuitry, this combined design is becoming more common. It is now possible to provide a complete set of control circuitry in the same integrated circuit chip with one or more power devices. This allows single chip products to be used for, for example, driving DC and stepper motors.

It is known to those skilled in the art that the current through an inductive load, such as a motor coil, cannot be cut off instantaneously. This property can cause problems with single chips which combine power and control devices. This is illustrated in the circuit of FIG. 1, in which MOS transistors 12, 14 are driving one side of inductive load 16. Typically, these types of inductive loads are connected into an H-bridge configuration, but the remainder of the bridge is not shown in FIG. 1. Instead, remaining circuitry on the other side of inductive load 16 is represented by resistive load 18.

Diode 20 is an artifact of the fabrication process for forming transistor 14, and in fact plays an important role in current switching when in circuits of the type shown in FIG. 1. Assume that, for example, current I1 is flowing through transistor 12, through inductor 16 and through resistive load 18 to node 22. Transistor 12 is on and transistor 14 is off. If transistor 12 is turned off, with transistor 14 remaining off, the current through the inductive load 16 cannot change instantaneously. However, current can no longer be drawn through transistor 12 from the supply voltage Vcc. This causes a phenomenon known as below-ground current injection, which causes current I2 to flow from ground, through diode 20, and through the loads 16, 18 to node 22.

This current, sometimes called a recirculation current in certain motor/driver configurations, is well known in the art. When the power driver transistors 12, 14 are discrete devices, this current causes little or no problem. However, if the control circuitry 12, 14 is formed on the same semiconductor substrate as the power devices, the presence of this current can adversely affect operation of such control circuitry.

Various isolation structures and techniques have been implemented to protect the control circuitry from below ground current injection. However, the structures and approaches used until now have not provided the degree of isolation which is desired.

It would therefore be desirable to provide an integrated circuit structured which give improved isolation and protection from below ground current injection.

SUMMARY OF THE INVENTION

Therefore, according to the present invention, an isolation structure is provided to give improved protection from below ground current injection. A first epitaxial region is provided between a power field effect device and nearby control circuitry. The first epitaxial region is tied to the substrate, and the ties are located between the first epitaxial region and the power field effect device. On the opposite side of the power device, preferably adjacent an edge of the integrated circuit chip, a second epitaxial region is formed. This epitaxial region is connected to the first epitaxial region, preferably by a metal interconnect line. A second set of substrate contacts is located between the power device and the second epitaxial region, and is tied to ground. The second epitaxial region encourages injection of current at a location spaced away from the control circuitry.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The structures described below do not form a complete integrated circuit. The present invention can be practiced in conjunction with integrated circuit fabrication techniques currently used in the art. The figures representing cross-sections of portions of an integrated circuit are not drawn to scale, but instead are drawn so as to illustrate the important features of the invention.

Figure 1:
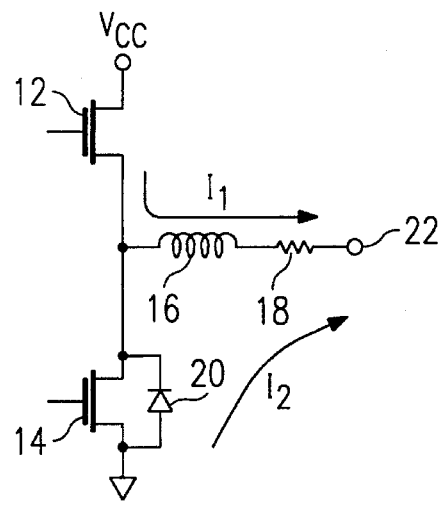
FIG. 1 is a schematic diagram of a portion of a circuit illustrated below ground current injection which accompanies switching of an inductive load.
Figure 2:
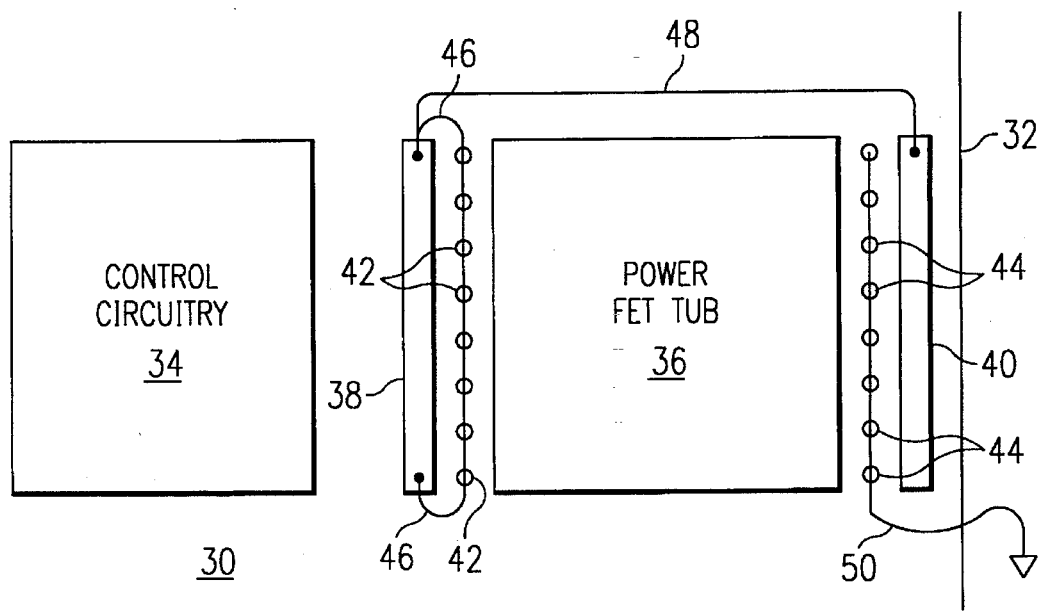
FIG. 2 is a top view, partially schematic, of an isolation structure formed in accordance with the present invention.

Referring to FIG. 2, integrated circuit structures are fabricated in a semiconductor substrate 30. Preferably, substrate 30 is doped to have a P conductivity type. Line 32 represents an edge of the completed chip, generally formed as a scribe line between multiple chips formed on a single semiconductor wafer. Box 34 represents generally control circuitry, which is typically CMOS circuitry used to control operation of the device. The precise nature of the transistors and other structures formed in the control circuitry box 34 do not form a part of the present invention, and are not illustrated in detail.

N-type epitaxial tub 36 is used for forming a power field effect transistor. The doping level for tub 36 is preferably N$^-$. Preferably, this is a DMOS device, but other types of power transistors could be formed in this region 36. Again, the details of the precise type of transistor formed in the tub 36 are not part of the present invention, and the power transistor formed in this region is not shown.

A first epitaxial isolation region 38 is formed in the substrate 30 between the control circuitry 34 and the power device tub 36. A second epitaxial region 40 is formed in the substrate between the power device tub 36 and the scribe line 32. Both of the epitaxial regions 38, 40 are preferably N$^-$. A number of substrate contacts 42 are formed between the first epitaxial region 38 and the power device tub 36. A second set of substrate contacts 44 are formed between the power device tub 36 and the second epitaxial region 40. The contacts 42, 44 are preferably P+ contacts, which allow good, low resistance contacts to be made with the substrate.

The first epitaxial region 38 is connected to the substrate 30 through a metal interconnect line 46 which makes contact with all of the substrate contacts 42. The effect of this interconnect line 46 is to tie the first epitaxial region 38 to the substrate in this region. A second metal interconnect line 48 connects the first epitaxial region 38 with the second epitaxial region 40. The purpose of this line is described below.

Substrate contacts 44 are all connected together by metal interconnect line 50, which is preferably connected to a ground pad (not shown). The result of the various substrate connections is to tie the first epitaxial region 38 closely to the substrate between itself and the power device tub 36, while the portion of the substrate between the power device tub 36 and the second epitaxial region 40 is well grounded.

When power device switching occurs so as to generate below ground current injection, the isolation structure shown in FIG. 2 operates as follows. Current is injected toward both the first and second epitaxial regions 38, 40. Since both regions are connected to the substrate on that side between the power device tub 36 and the control circuitry 34, the voltage of the substrate in that region is forced below ground. However, the substrate on the side of the power device tub 36 toward the scribe line 32 is well connected to ground. Thus, the right hand side of the substrate, as shown in FIG. 2, has a higher voltage than does that portion of the substrate toward the control circuitry 34. This means that current injection will primarily occur on the right hand side of the power device tub 36, minimizing the potential of incorrect operation of the control circuitry 34.

Both of the epitaxial regions 38, 40 act as parasitic collectors, but the voltage of the first epitaxial region 38 is typically a volt or more below ground. Thus, more current is injected toward to the second epitaxial region 40. However, the more current which is injected toward region 40, the more the voltage at the substrate contacted by substrate contacts 42 is forced below ground. This is a positive feedback event which tends to cause the great majority of injected current to occur on the scribe line side of the power device tub 36.

If the second epitaxial region 40 were missing, current would have to be injected toward the control circuitry 34 because the first epitaxial region 38 would act as the parasitic collector. Operation of first epitaxial region 38 alone can only force the substrate in this lower region below ground if there is an actual current injection in that region so that a certain amount of current injection toward to the control circuitry 34 is unavoidable. However, the addition of the second epitaxial region 40, and connecting line 48, means that the substrate in the physical proximity of first epitaxial region 38 can be driven below ground while injecting current on the scribe line side of the power device tub 36.

Figure 3:
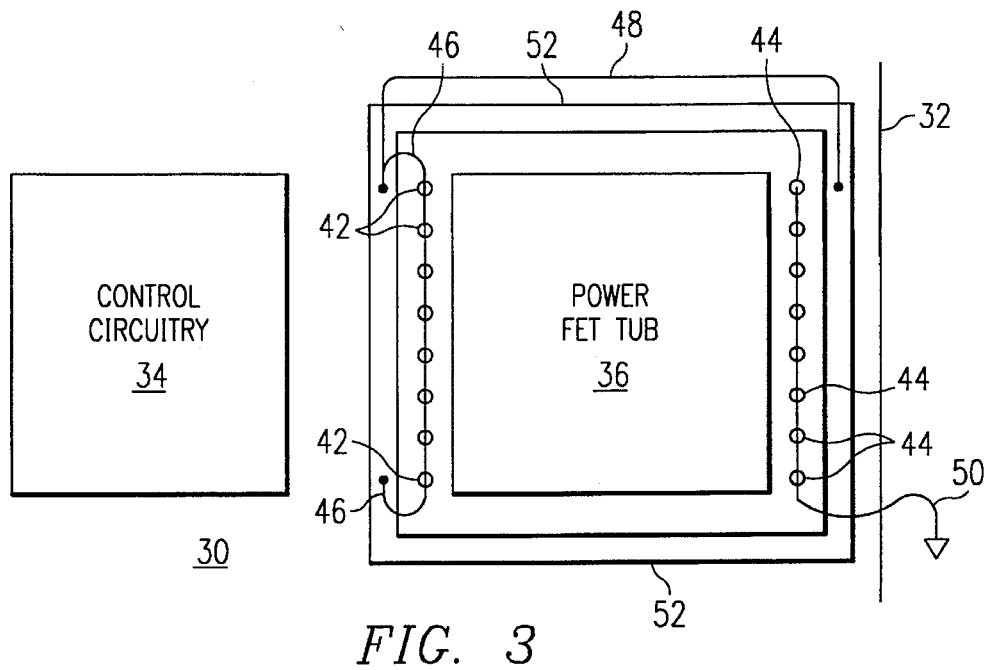
FIG. 3 is a top view, partially schematic, of an alternative isolation structure according to the present invention.

Referring to FIG. 3, an alternate embodiment is shown for a preferred isolation device. Instead of the first and second epitaxial regions 38, 40, a single ring epitaxial region 52 is formed which completely surrounds the power device tub 36. The far side of the ring region 52 is still preferably strapped, via metal interconnect 48, to the side of the ring 52 between the power device tub 36 and the control circuitry 34. This causes the ring to operate in much the manner as described in connection with FIG. 2. In some designs, the interconnect line 48 can be eliminated, with the ring 52 itself providing the necessary connection.

In both FIGS. 2 and. 3, the connections between the substrate contacts 42, 44 and the various epitaxial regions 38, 52 are shown only schematically. In actuality, the metal interconnect lines could make contact at a discreet number of $N^+$ regions within the epitaxial regions 38, 52. Alternatively, the metal contact could lay along the epitaxial region for a relatively large percentage of its length, making a good, low resistance contact to the epitaxial region 38, 52. In a similar manner, multiple contacts to highly doped regions are preferably used for the substrate contacts. Various techniques can be used for making these contacts to the various doped regions within the substrate, as is known in the art.

Figure 4:
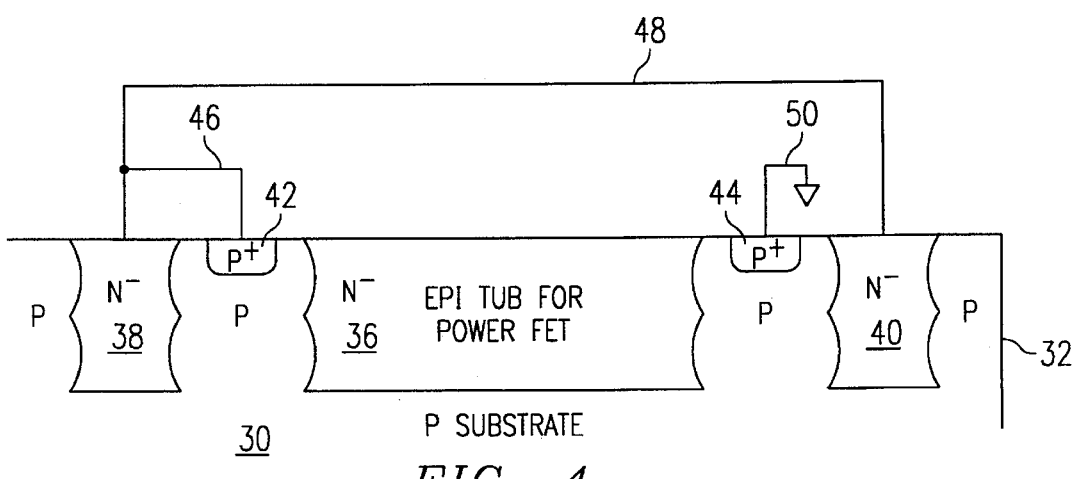
FIG. 4 is a cross-sectional view of a portion of the structures of FIGS. 2 and 3.

Referring to FIG. 4, a cross-sectional view is shown in a portion of the circuits of either FIGS. 2 or 3. This figure illustrates how the various structures shown in FIGS. 2 and 3 are formed within the substrate itself. The boundaries of the various P and N regions are characteristic of the well known process of forming a first set of doped regions, followed by growing an epitaxial layer over the substrate and forming a second set of doped regions aligned with the first. As is known in the art, and will be appreciated by those skilled in the art, alternative techniques can be used to form the various doped regions within the substrate.

As described above, the addition of an extra epitaxial region on the scribe line side of the power device tub causes a large percentage of the recirculating current to flow toward the scribing line. This lowers the amount of injected current which flows toward the control circuitry, and minimizes adverse effects caused by this below ground current injection. Formation of the extra structures required to provide this extra isolation is extremely simple, and is completely compatible with the processes already used to form the remainder of the devices structures which are included in the chip.

While the invention has been particularly shown and described with reference to a preferred embodiment, it will be understood by those skilled in the art that various changes in form and detail may be made therein without departing from the spirit and scope of the invention.

What is claimed is:

1. A protective structure for an integrated circuit having a power transistor integrated on a single chip with control devices, comprising:

a first epitaxial region, within the substrate, between the power transistor and the control devices;

a first contact, between the first epitaxial region and the substrate, placed between the first epitaxial region and the power transistor;

a second epitaxial region, within the substrate, on a side of the power transistor opposite the control devices, wherein the second epitaxial region is electrically connected to the first epitaxial region; and a second contact to the substrate, connected to ground, placed between the power transistor and the second epitaxial region.

2. The structure of claim 1, wherein the power transistor comprises a field effect transistor.

3. The structure of claim 2, wherein the field effect transistor comprises a DMOS device.

4. The structure of claim 1, wherein the second epitaxial region is connected to the first epitaxial region by a metal interconnect line.

5. The structure of claim 1, wherein the second epitaxial region is connected to the first epitaxial region by third epitaxial regions between the first and second epitaxial regions, the third epitaxial regions being within the substrate and connecting the first and second epitaxial regions so as to form a continuous epitaxial region surrounding the power transistor.

6. The structure of claim 5, wherein the second epitaxial region is further connected to the first epitaxial region by a metal interconnect line.

7. The structure of claim 1, wherein the first epitaxial region is connected to the first contact by a metal interconnect line.

8. The structure of claim 1, wherein the first contact comprises a plurality of highly doped contact locations spaced in the substrate between the first epitaxial region and the power transistor.

9. The structure of claim 1, wherein the second contact comprises a plurality of highly doped contact locations spaced in the substrate between the second epitaxial region and the power transistor.

10. The structure of claim 1, wherein the first and second epitaxial regions have a first conductivity type, the substrate has a second conductivity type, and the power transistor is formed in an epitaxial tub having the first conductivity type.

11. The structure of claim 10, wherein the first conductivity type is N-type, and the second conductivity type is P-type.

12. The structure of claim 11, wherein the first and second epitaxial regions have a doping concentration of $N^-$.

13. The structure of claim 1, wherein the second epitaxial region is placed between the power transistor and an edge of the substrate.

14. A protective structure for an integrated circuit having a power transistor integrated on a single chip with control devices, comprising:
- a first epitaxial region, within the substrate, between the power transistor and the control devices;
- a first contact, between the first epitaxial region and the substrate, placed between the first epitaxial region and the power transistor;
- a second contact to the substrate, connected to ground, placed adjacent the power transistor on a side opposite the first contact; and
- means for causing current injected into the substrate to flow primarily on the side of the power transistor opposite the first contact.

15. The structure of claim 14, wherein the first epitaxial region functions as a first collector for a parasitic bipolar device, and wherein the means for causing injected current to flow comprises a second epitaxial region, placed in the substrate on the opposite side of the power transistor and spaced further therefrom than the second contact, and electrically connected to the first epitaxial region, wherein the second epitaxial region acts as a second collector for the parasitic bipolar device.

16. The structure of claim 14, wherein the first epitaxial region functions as a first collector for a parasitic bipolar device, and wherein the means for causing injected current to flow comprises a second epitaxial region connected to the first epitaxial region so as to form a ring completely surrounding the power transistor.

17. The structure of claim 16, further comprising a metal interconnect connected to the first epitaxial region, and to the second epitaxial region at a location on the opposite d=side of the power transistor.

18. A protective structure for an integrated circuit having a power transistor integrated on a single chip with control devices, comprising:
- a first contact to the substrate, placed between the control devices and the power transistor;
- a second contact to the substrate, connected to ground, placed adjacent the power transistor on a side opposite the control devices; and
- an epitaxial region in the substrate, forming a ring around the power transistor outside the first and second contacts, wherein the epitaxial region is electrically connected to the first contact.

19. The structure of claim 18, wherein the power transistor comprises a field effect transistor.

20. The structure of claim 19, wherein the field effect transistor comprises a DMOS device.

21. The structure of claim 18, wherein a portion of the epitaxial region on the opposite side of the power transistor is further connected to the first epitaxial region by a metal interconnect line.

22. The structure of claim 18, wherein the epitaxial region is connected to the first contact by a metal interconnect line.

23. The structure of claim 18, wherein the first contact comprises a plurality of highly doped contact locations spaced in the substrate between the epitaxial region and the power transistor.

24. The structure of claim 18, wherein the second contact comprises a plurality of highly doped contact locations spaced in the substrate between the epitaxial region and the power transistor.

25. The structure of claim 18, wherein the epitaxial region has a first conductivity type, the substrate has a second conductivity type, and the power transistor is formed in an epitaxial tub having the first conductivity type.

26. The structure of claim 25, wherein the first conductivity type is N-type, and the second conductivity type is P-type.

27. The structure of claim 26, wherein the first and second epitaxial regions have a doping concentration of $N^-$.

* * * * *